United States Patent
Tsen et al.

(10) Patent No.: US 8,394,719 B2
(45) Date of Patent: Mar. 12, 2013

(54) SYSTEM AND METHOD FOR IMPLEMENTING MULTI-RESOLUTION ADVANCED PROCESS CONTROL

(75) Inventors: Andy Tsen, Chung-Ho (TW); Jin-Ning Sung, Pingjhen (TW); Po-Feng Tsai, Hsinpu Township, Hsinchu County (TW); Jong-I Mou, Hsinpu Township, Hsinchu County (TW); Yen-Wei Cheng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 54 days.

(21) Appl. No.: 13/106,711

(22) Filed: May 12, 2011

(65) Prior Publication Data

US 2011/0213478 A1 Sep. 1, 2011

Related U.S. Application Data

(63) Continuation-in-part of application No. 12/416,595, filed on Apr. 1, 2009, now Pat. No. 7,951,615.

(51) Int. Cl.
*H01L 21/302* (2006.01)
*H01L 21/461* (2006.01)

(52) U.S. Cl. ...... 438/692; 438/14; 257/48; 257/E21.006; 257/E21.027; 257/E21.23; 257/E21.249; 257/E21.304; 257/E21.521; 257/E21.548

(58) Field of Classification Search ............... 438/692, 438/14, 106, 700; 257/48, E21.006, E21.23, 257/E21.027, E21.249, E21.304, E21.521, 257/E21.548

See application file for complete search history.

(56) References Cited

U.S. PATENT DOCUMENTS

| 6,957,177 | B1 | 10/2005 | Brumitt et al. |
| 7,472,953 | B1 | 1/2009 | Lalji |
| 7,818,797 | B1 | 10/2010 | Fan et al. |
| 7,951,615 | B2 * | 5/2011 | Tsen et al. ............ 438/14 |
| 2005/0246155 | A1 | 11/2005 | Brumitt et al. |
| 2011/0213478 | A1 | 9/2011 | Tsen et al. |

* cited by examiner

*Primary Examiner* — David Nhu
(74) *Attorney, Agent, or Firm* — Haynes and Boone, LLP

(57) ABSTRACT

System and method for implementing multi-resolution advanced process control ("APC") are described. One embodiment is a method including obtaining low resolution metrology data and high resolution metrology data related to a process module for performing a process on the wafer. A process variable of the process is modeled as a function of the low resolution metrology data to generate a low-resolution process model and the process variable is modeled as a function of the high resolution metrology data to generate a high-resolution process model. The method further includes calibrating the low resolution process model; combining the calibrated low resolution process model with the high resolution process model to generate a multi-resolution process model that models the process variable as a function of both the low resolution metrology data and the high resolution metrology data; and analyzing a response of the multi-resolution process model and the low and high resolution metrology data to control performance of a process module.

20 Claims, 2 Drawing Sheets

SYSTEM AND METHOD FOR IMPLEMENTING MULTI-RESOLUTION ADVANCED PROCESS CONTROL

CROSS-REFERENCE UNDER 35 U.S.C. §120

This application is a continuation-in-part of and claims the benefit under 35 U.S.C. §120 to commonly-assigned, U.S. patent application Ser. No. 12/416,595, filed on Apr. 1, 2009, now U.S. Pat. No. 7,951,615, which is hereby incorporated by reference in its entirety.

BACKGROUND

The present disclosure relates generally to Advanced Process Control ("APC") as applied to integrated circuit ("IC") fabrication and, more particularly, to system and method for implementing a multi-resolution APC technique.

APC has become an essential component in semiconductor fabrication facilities ("fabs") for enabling continued improvement of device yield and reliability at a reduced cost. Significant elements of APC include integrated metrology, fault detection and classification, and run-to-run control. APC aids in reducing process variation as well as production costs. A key requirement for effective APC is that metrology tools are available to measure key parameters within an acceptable time frame. Additionally, methods must be provided for analyzing and interpreting measurement data. In practice, APC requires rich in-line measurements because the manufacturing processes are usually subjected to disturbance and drift caused by a variety of sources. Traditionally, APC has been based on constant or near-constant time sequence data inputs; however, it is recognized that the complexity of processes, tools, and products results in multiple data sources that impact the control performance with different time frequency. In general, an APC controller operates with disturbances from both the wafer and chamber conditions. The disturbances, which may include, for example, metrology bias, calibration offsets, and the like, may be of different resolutions. Moreover, some of the disturbances are effective, while others are not.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to APC as applied to semiconductor fabrication and, more particularly, to system and method for implementing a multi-resolution APC. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Figure 1:
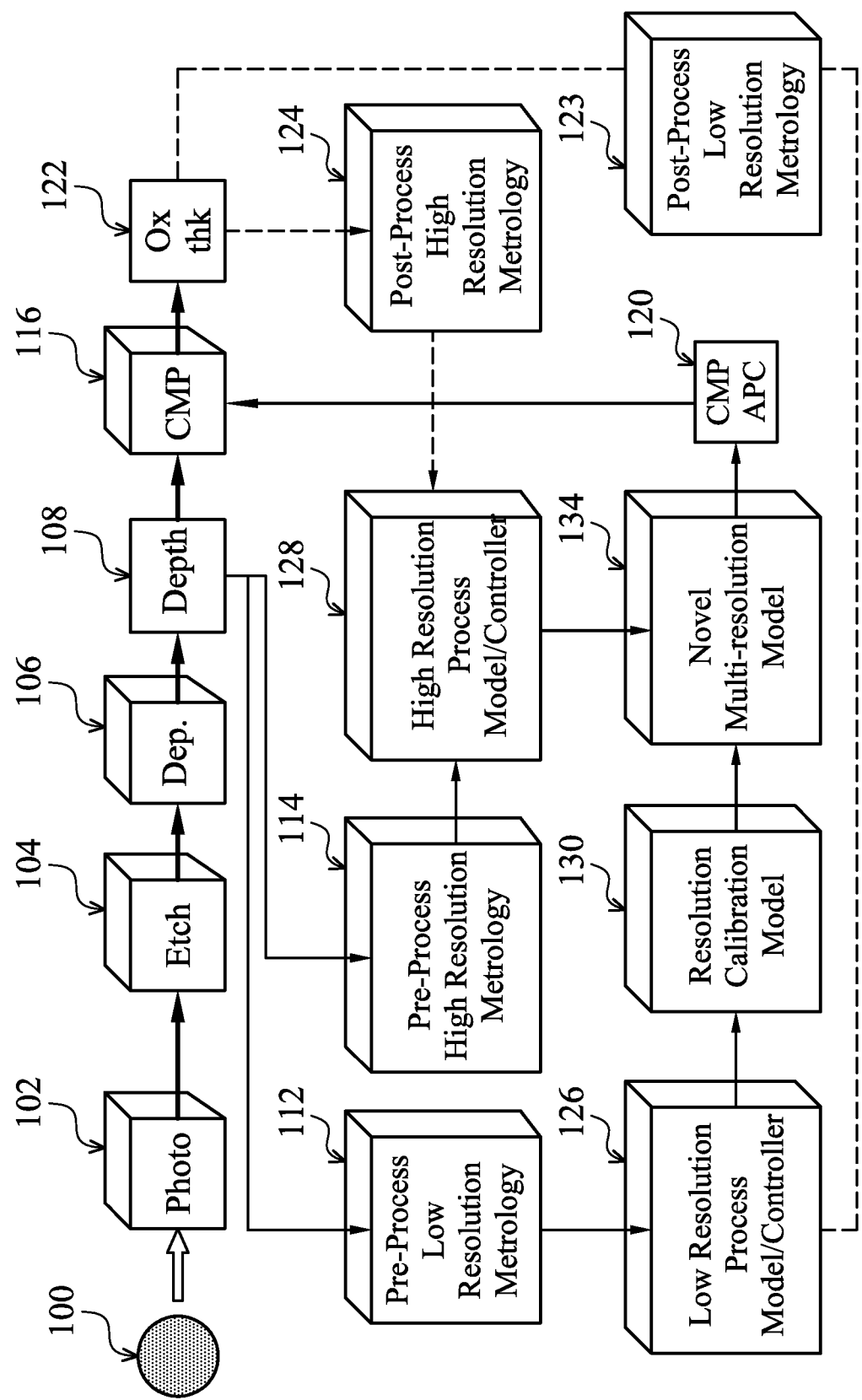
FIG. 1 illustrates a portion of a process for fabricating ICs from semiconductor wafers in accordance with embodiments described herein.

FIG. 1 illustrates a portion of an IC fabrication system for fabricating ICs from semiconductor wafers, such as a wafer 100, in accordance with embodiments described herein. The process shown in FIG. 1 includes a photolithography module 102 for performing a photolithography process on the wafer 100 in a conventional manner. Subsequently, an etch module 104 performs an etch process on the wafer 100 to create trenches therein in a conventional manner. After trenches have been etched by the etch process, a deposition module 106 performs a deposition process on the wafer 100 to deposit oxide in the trenches in a conventional manner. Following completion of the deposition process, a depth measurement module 108 measures the depth of the oxide deposited on the wafer during the deposition process and generates metrology data, which in the illustrated embodiment comprises pre-process low resolution metrology data 112 and pre-process high resolution metrology data 114, as will be described in greater detail below.

A chemical-mechanical polish ("CMP") module 116 performs a CMP process on the wafer 100 in a conventional manner and in accordance with control signals 118 received from a CMP APC controller module 120. The module 122 measures the thickness of the deposited oxide and generates post-process low resolution metrology data 123 and post-process high resolution metrology data 124, as described in greater detail below.

As used herein, "low resolution metrology data" refers to data that requires fewer measurements to be made in the same space as compared to "high resolution metrology data." For example, in a case in which wafer depth is employed as the control target of a CMP process, two types of measurements are typically taken: mean depth and depth profile. "Mean depth" requires approximately three or fewer measurements to be made in different locations on a wafer, with the average of these measurements comprising the "mean depth" for the wafer. In contrast, "depth profile" requires approximately ten or more measurements to be made in different locations on the wafer, after which some index, such as contour plot, surface plot, standard deviation, or maximum difference between measurements, may be used to define the "depth profile" for the wafer, with the maximum difference between measurements being deemed the depth profile "range." It will be recognized that, in the illustrated example, CMP wafer mean depth is a function of polishing time, whereas CMP wafer depth profile is a function of a zone pressure profile.

As shown in FIG. 1, the pre- and post-process low resolution metrology data 112, 123, is used to generate a low resolution process model/controller ("LRPM/C") 126. The difference between the pre-process data 112 and the post-process data 123 may be deemed the "polish amount;" that is, it is the amount of material that is successfully removed by the CMP process module 116. More specifically, the polish amount represents the results of the polishing motion provided by the CMP module 116 for a particular polishing time t at a particular pressure. The polish amount is calculated using the low resolution metrology data 112, 123 (i.e., wafer mean depth in the present example), therefore, the mathematical model of the relationship between polish amount and polishing time t is the "model" portion of the LRPM/C 126. Similarly, the polishing time t can be used to control the polish amount; therefore, a controller for implementing this is the "controller" portion of the LRPM/C 126. Accordingly, in the illustrated embodiment, the LRPM/C 126 is used to adjust/control CMP polishing time t.

Similarly, the pre- and post-processing high resolution metrology data 114, 124, is used to generate a high resolution process model/controller ("HRPM/C") 128. In particular, the difference between a corresponding pair of points of pre-process data 114 and the post-process data 124 for a particular zone on the wafer may be deemed the "zone polish amount;" that is, it is the amount of material that is successfully removed by the CMP process module 116 in that zone. More specifically, the zone polish amount represents the results of the polishing motion provided by the CMP module 116 for a particular polishing time at a particular pressure. The zone polish amount is calculated using the high resolution metrology data 114, 124 (i.e., depth profile in the present example), therefore, the mathematical model of the relationship between zone pressure and polish amount within the zone is the "model" portion of the HRPM/C 128. Similarly, the zone pressure for a zone can be used to control the polish amount within that zone and thereby minimize the depth range using zone pressure adjustment. As a result, a controller for implementing this effect comprises the "controller" portion of the HRPM/C 128. Accordingly, in the illustrated embodiment, the HRPM/C 126 is used to adjust/control CMP zone pressure P1-Pn, where n is the number of controllable pressure zones of the wafer.

As shown in FIG. 1, the output of the LRPM/C 126 is provided to a resolution/calibration model 130, which is used to align the units of low frequency, or resolution (i.e., polishing time t) with the units of high frequency, or resolution (i.e., zone pressure P1-Pn). Using the illustrated CMP process as an example, as previously indicated, polish amount is a function of both polishing time and pressure on the surface of the wafer. The resolution/calibration model 130 calibrates the low resolution data with the high resolution data such that the impact of both polishing time t and zone pressure P1-Pn can be taken into account in the Novel Multi-Resolution Model 134, which models polish amount as a function of both polishing time and zone pressure. The Novel Multi-Resolution Model 134 and oxide thickness data 122 are provided to the CMP APC 120, which evaluates the data and the inverse of the model 134 and provides appropriate control signals to the CMP module 116 to control the operation thereof in accordance with two data sources; i.e., wafer mean depth and wafer pressure profile. As a result, the CMP APC 120 provides more precise CMP processing control than would be the case if only polish time t were considered.

It will be recognized that each of the modules illustrated in and described with reference to FIG. 1 includes appropriate processing, control, storage, and input/output capabilities, as well as other equipment necessary for performing the functions described with respect thereto. Additionally, it will be recognized that one or more of the modules illustrated in and described with reference to FIG. 1 may be omitted from the process and/or that additional modules for implementing other functions may be included.

Figure 2:
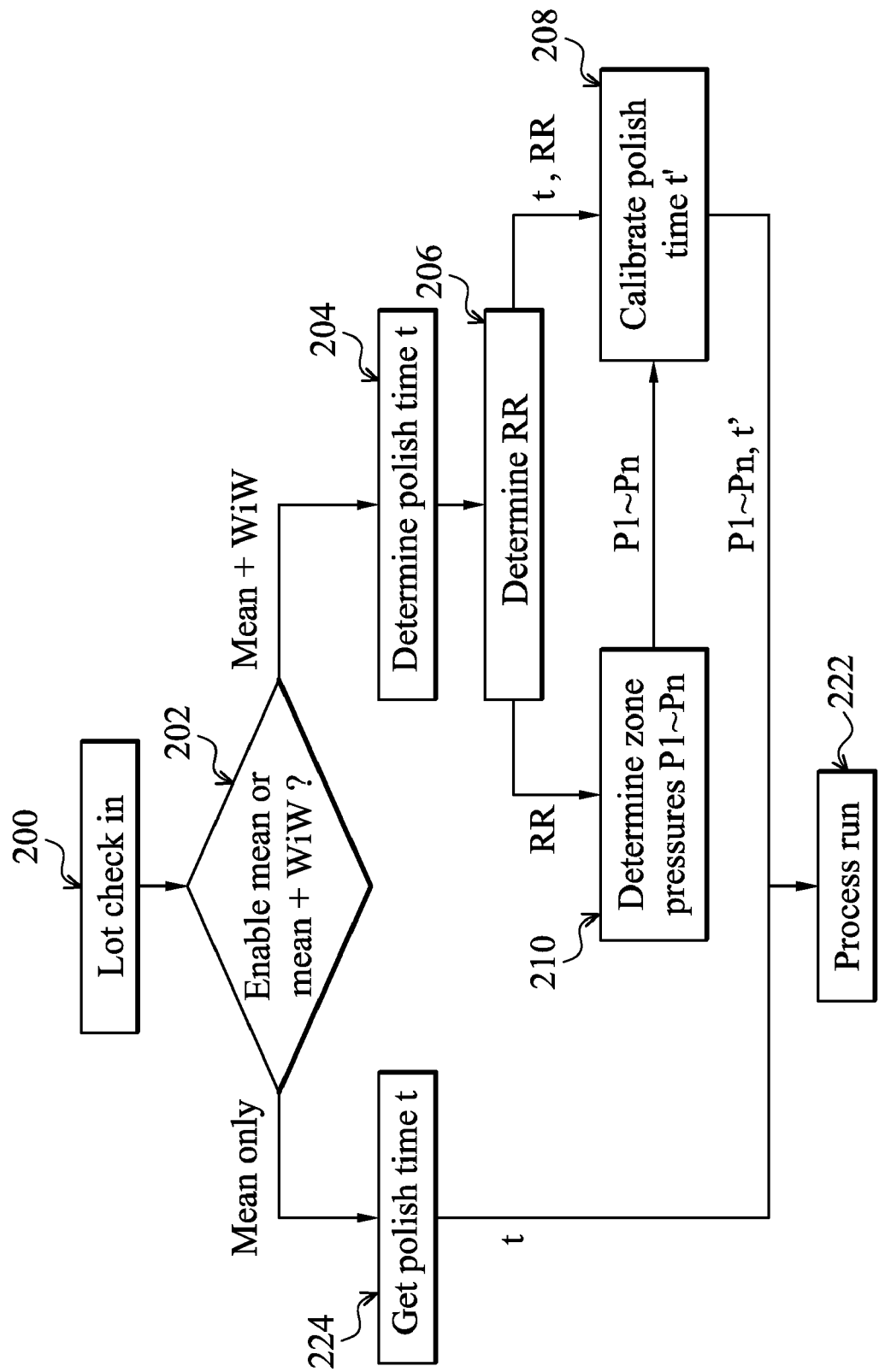
FIG. 2 is a flowchart of the portion of the IC fabrication process shown in FIG. 1.

FIG. 2 illustrates a flowchart of the operation of one embodiment of the process portion illustrated in FIG. 1. In step 200, a lot is checked in as usual. In step 202, a determination is made whether to enable mean only control (in accordance with prior art methods) or mean+pressure profile (or "mean+WiW") control. If it is determined in step 202 that mean+WiW control is enabled, execution proceeds to step 204, in which polishing time t is determined using the LRPM/C 126. In step 206, a remove rate ("RR") is calculated using the polishing time t. The value of RR is provided to a step 208, in which the zone pressure profile P1-Pn is determined using the HRPM/C 128. The value for RR and the zone pressure profile P1-Pn, are provided to a step 210. In step 208, polishing time t is calibrated by the Resolution Calibration Model 130, which characterizes the impact of zone pressure change on polishing time for each zone n. The result of step 210 is the generation of a calibrated polishing time t' for each of the zones n. The pressure profile P1-Pn and the calibrated polishing times t' are provided to The process run is then performed in step 222 using pressure profile P1-Pn and the calibrated polishing times t'. In contrast, if it is determined in step 202 that mean only control is enabled, execution proceeds to step 224, in which polishing time t is determined, and then proceeds directly to step 222, where the process run is performed using only the polishing time t.

One embodiment is a method comprising obtaining low resolution metrology data and high resolution metrology data related to a process module for performing a process on the wafer; modeling a process variable of the process as a function of the low resolution metrology data to generate a low-resolution process model; and modeling the process variable as a function of the high resolution metrology data to generate a high-resolution process model. The method further includes calibrating the low resolution process model; combining the calibrated low resolution process model with the high resolution process model to generate a multi-resolution process model that models the process variable as a function of both the low resolution metrology data and the high resolution metrology data; and analyzing a response of the multi-resolution process model and the low and high resolution metrology data to control performance of a process module.

Another embodiment is a system for fabricating ICs from a semiconductor wafer. The system includes means for obtaining low resolution metrology data and high resolution metrology data related to a process module for performing a process on the wafer; means for generating a low resolution process model of a process variable of the process; and means for generating a high resolution process model of the process variable. The system further includes means for calibrating the low resolution process model; means for generating a multi-resolution process model from the calibrated low resolution process model and the high resolution process model for modeling the process variable as a function of both the low resolution metrology data and the high resolution metrology data; and means for controlling performance of the process using a response of the multi-resolution process model and the low and high resolution metrology data.

Yet another embodiment is a method for implementing a multi-resolution APC in a semiconductor fabrication process. The method comprises obtaining pre-process high and low resolution metrology data with regard to a process using a first metrology tool; performing the process on the semiconductor wafer using a process tool; and obtaining post-process high and low resolution metrology data with regard to the process using a second metrology tool. The method further comprises modeling a process variable of the process as a function of the pre- and post-process low resolution metrology data to generate a low-resolution process model; modeling the process variable as a function of the pre- and post-process high resolution metrology data to generate a high-resolution process model; and calibrating the low resolution process model. The calibrated low resolution process model is combined with the high resolution process model to generate a multi-resolution process model that models the process variable as a function of both the low resolution metrology data and the high resolution metrology data and a response of the multi-resolution process model and the post-process low and high resolution metrology data is analyzed to control performance of the process using an APC controller.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Moreover, each of the modules depicted in the drawings can be implemented on multiple devices, including computing devices, and implementation of multiple ones of the depicted modules may be combined into a single device, including a computing device. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method for fabricating ICs from a semiconductor wafer, the method comprising:
    obtaining low resolution metrology data and high resolution metrology data related to a process module for performing a process on the semiconductor wafer;
    modeling a process variable of the process as a function of the low resolution metrology data to generate a low-resolution process model;
    modeling the process variable as a function of the high resolution metrology data to generate a high-resolution process model;
    calibrating the low resolution process model;
    combining the calibrated low resolution process model with the high resolution process model to generate a multi-resolution process model that models the process variable as a function of both the low resolution metrology data and the high resolution metrology data; and
    analyzing a response of the multi-resolution process model and the low and high resolution metrology data to control performance of a process module.

2. The method of claim 1 wherein the obtaining comprises measuring an oxide thickness prior to and subsequent to the process.

3. The method of claim 1 wherein the process comprises a chemical/mechanical polish ("CMP") process.

4. The method of claim 1 wherein the low resolution metrology data comprises wafer mean depth.

5. The method of claim 1 wherein the high resolution metrology data comprises wafer depth profile.

6. The method of claim 1 wherein the modeling the process variable as a function of the low resolution metrology data comprises modeling a polish amount as a function of polish time t.

7. The method of claim 1 wherein the modeling the process variable as a function of the high resolution metrology data comprises modeling a polish amount as a function of pressure profile P1-Pn.

8. The method of claim 1 wherein the calibrating comprises determining, for each zone n, determining a polishing time t' corresponding to zone pressure Pn.

9. A system for fabricating ICs from a semiconductor wafer, the system comprising:
    means for obtaining low resolution metrology data and high resolution metrology data related to a process module for performing a process on the semiconductor wafer;
    means for generating a low resolution process model of a process variable of the process;
    means for generating a high resolution process model of the process variable;
    means for calibrating the low resolution process model;
    means for generating a multi-resolution process model from the calibrated low resolution process model and the high resolution process model for modeling the process variable as a function of both the low resolution metrology data and the high resolution metrology data; and
    means for controlling performance of the process using a response of the multi-resolution process model and the low and high resolution metrology data.

10. The system of claim 9 wherein the means for obtaining comprises measuring an oxide thickness prior to and subsequent to the process.

11. The system of claim 9 wherein the process comprises a chemical/mechanical polish ("CMP") process.

12. The system of claim 11 wherein the low resolution metrology data comprises wafer mean depth and the high resolution metrology data comprises wafer depth profile.

13. The system of claim 9 wherein the means for generating the low resolution process model comprises modeling a polish amount as a function of polish time t.

14. The system of claim 9 wherein the means for generating the low resolution process model comprises modeling a polish amount as a function of pressure profile P1-Pn.

15. The system of claim 9 wherein the means for calibrating comprises means for determining, on a per-zone basis, a polishing time t' corresponding to zone pressure Pn.

16. A method for implementing a multi-resolution APC in a semiconductor fabrication process, the method comprising:
    obtaining pre-process high and low resolution metrology data with regard to a process using a first metrology tool;
    performing the process on a semiconductor wafer using a process tool;
    obtaining post-process high and low resolution metrology data with regard to the process using a second metrology tool;
    modeling a process variable of the process as a function of the pre- and post-process low resolution metrology data to generate a low-resolution process model;
    modeling the process variable as a function of the pre- and post-process high resolution metrology data to generate a high-resolution process model;
    calibrating the low resolution process model;
    combining the calibrated low resolution process model with the high resolution process model to generate a multi-resolution process model that models the process variable as a function of both the low resolution metrology data and the high resolution metrology data; and analyzing a response of the multi-resolution process model and the post-process low and high resolution metrology data to control performance of the process using an APC controller.

17. The method of claim 16 wherein the process comprises a chemical/mechanical polish ("CMP") process.

18. The method of claim 16 wherein the low resolution metrology data comprises wafer mean depth and the high resolution metrology data comprises wafer depth profile.

19. The method of claim 16 wherein the modeling the process variable as a function of the low resolution metrology data comprises modeling a polish amount as a function of polish time t and wherein the modeling a process variable as a function of the high resolution metrology data comprises modeling a polish amount as a function of pressure profile $P_1$-$P_n$.

20. The method of claim 16 wherein the calibrating comprises determining, for each zone n, determining a polishing time t' corresponding to zone pressure $P_n$.

* * * * *